United States Patent [19]

Bokil et al.

[11] Patent Number: 4,547,961

[45] Date of Patent: Oct. 22, 1985

[54] METHOD OF MANUFACTURE OF MINIATURIZED TRANSFORMER

[75] Inventors: Delip R. Bokil, Winchester; William H. Morong, III, Newton, both of Mass.

[73] Assignee: Analog Devices, Incorporated, Norwood, Mass.

[21] Appl. No.: 403,805

[22] Filed: Jul. 30, 1982

Related U.S. Application Data

[63] Continuation-in-part of Ser. No. 206,838, Nov. 14, 1980, abandoned.

[51] Int. Cl.$^4$ ............................................. H01F 41/06
[52] U.S. Cl. .................................. 29/602 R; 29/846; 29/851; 336/200
[58] Field of Search ..................... 29/602 R, 605, 846, 29/851; 336/83, 200, 232, 205, 229

[56] References Cited

U.S. PATENT DOCUMENTS 3,518,756  7/1970  Bennett et al. ........................ 29/846
3,685,144  8/1972  Trimble ................................ 29/603

FOREIGN PATENT DOCUMENTS 2409881  9/1975  Fed. Rep. of Germany .
1494087  12/1977  United Kingdom .
2040589  8/1980  United Kingdom .

OTHER PUBLICATIONS

"Printed Delay Line"; Altmann et al.; IBM Tech. Disclosure Bulletin; vol. 8, No. 5; Oct. 1965.

Primary Examiner—Carl E. Hall
Attorney, Agent, or Firm—Parmelee, Bollinger & Bramblett

[57] ABSTRACT

A miniaturized thick-film isolation transformer comprising two rectangular substrates each carrying successive screen-printed thick-film layers of dielectric with spiral planar windings embedded therein. The spiral windings comprise conductors formed of fused conductive particles embedded within a layer of dielectric insulating means solidified by firing at high temperature to form a rigid structure with the windings hermetically sealed within the dielectric and conductively isolated from each other within the transformer. The substrates are formed at opposite ends thereof with closely adjacent connection pads all located at a single level to accommodate automated connection making. Connections between the pads and the windings are effected by conductors formed of fused conductive particles. The substrates and the dielectric layers are formed with a central opening in which is positioned the central leg of a three-legged solid magnetic core. The remaining portions of the core surround the two substrates to form a compact rugged construction especially suitable for assembly with hybrid integrated circuit components.

4 Claims, 6 Drawing Figures

METHOD OF MANUFACTURE OF MINIATURIZED TRANSFORMER

This is a continuation-in-part of application Ser. No. 206,838, filed Nov. 14, 1980, now abandoned.

BACKGROUND OF THE INVENTION

1. Field of the Invention

This invention relates to transformers. More particularly, this invention relates to miniaturized transformers suitable for use in small-sized electrical devices such as hybrid integrated circuit components, or small-sized modular components.

2. Description of the Prior Art

As demand for small-sized electrical components has increased over the years, there has been a corresponding need to provide miniaturized transformers for components requiring such elements. Generally speaking, the problem of transformer miniaturization has been quite difficult relative to miniaturization of other kinds of electrical elements, and this has particularly been true where low-frequency applications are involved.

For a number of reasons, traditional transformer design concepts have not provided a suitable basis for making such miniaturized transformers. For example, conventional wound transformers are difficult to make in small sizes, especially because the windings typically must be made of very tiny wire. The cost of manufacture also is considerable, due to the large amount of painstaking labor required. Moreover, it has been difficult to achieve high performance with such small-sized devices of conventional design.

Various proposals have been made from time to time seeking a solution to the problem of making minaturized transformers, but none of these proposals has resulted in a truly satisfactory transformer construction.

SUMMARY OF THE INVENTION

In a preferred embodiment of the present invention to be described hereinafter in detail, a compact transformer construction is provided wherein the transformer windings are arranged in planar spiral configuration, with each winding embedded in a layer of solid insulating dielectric securely attached to a rigid substrate. Both the substrate and the insulating dielectric are formed with a common opening about which the windings are disposed, and a solid magnetic core extends through that opening to form a low-reluctance closed magnetic circuit for the transformer windings. Advantageously, a transformer in accordance with this invention may comprise two such rigid substrates carrying identical sets of planar spiral windings disposed about the common solid magnetic core.

The layers of insulating dielectric and windings embedded therein preferably are laid down on the substrate by well-established thick-film deposition processes. The windings comprise conductors formed of fused-conductive particles embedded within a layer of dielectric insulating means solidified by firing at high temperaure to form a rigid structure with the windings hermetically sealed therein and conductively isolated from each other within the transformer. With such an arrangement it is possible to make, at low cost, a rugged multi-layered transformer structure combining small size, excellent performance, high reliability, and ready adaptability to standard component assembly techniques, as will be described in more detail.

Accordingly, it is an object of the present invention to provide a superior transformer of small size. Another object of the invention is to provide such a transformer which is capable of economical manufacture and suitable for standard assembly techniques. Yet another object of the invention is to provide such a transformer which can be used for low-frequency applications and which has high performance capabilities including excellent magnetic coupling, good linearity, and the ability to withstand high voltages between windings. Still other objects, aspects and advantages of the invention will in part be pointed out in, and in part apparent from, the following detailed description of a preferred embodiment of the invention, considered together with the accompanying drawings.

DETAILED DESCRIPTION OF A PREFERRED EMBODIMENT

Figure 1:
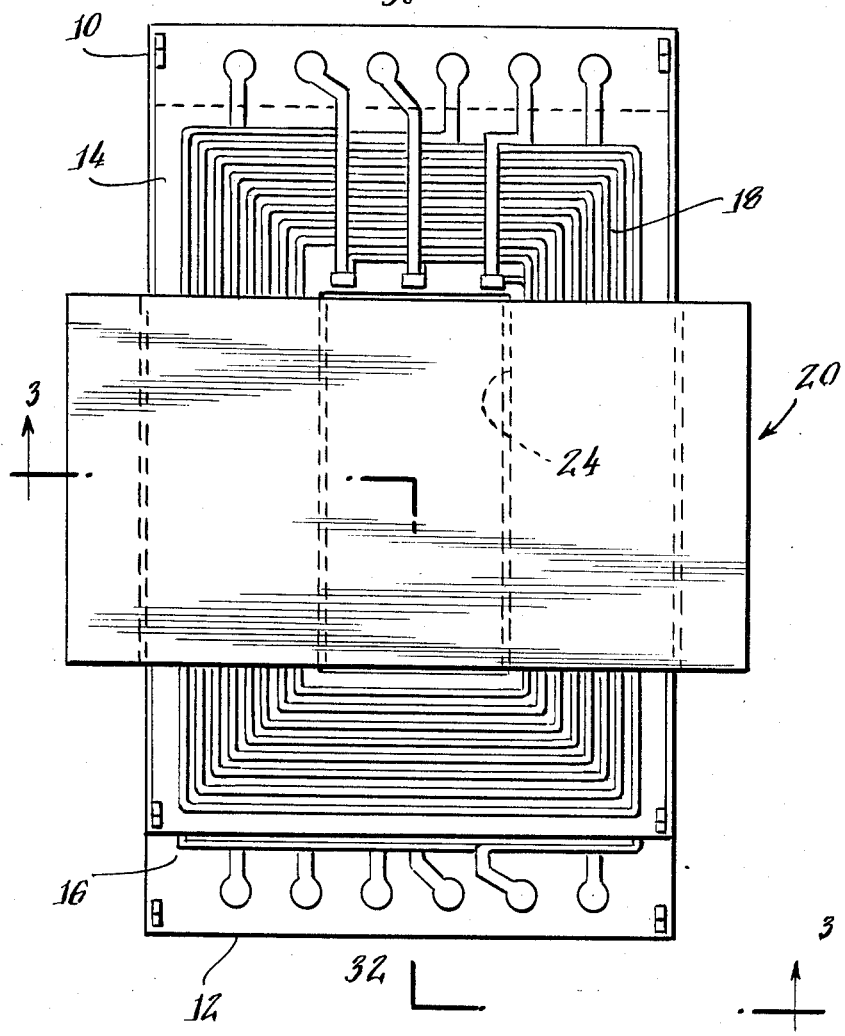
FIG. 1 is a plan view of a transformer constructed in accordance with the present invention. (Note: The opaque layers of insulating dielectric are not shown in this view in order to present the general configuration of the metallized windings embedded in the dielectric.)
Figure 2:
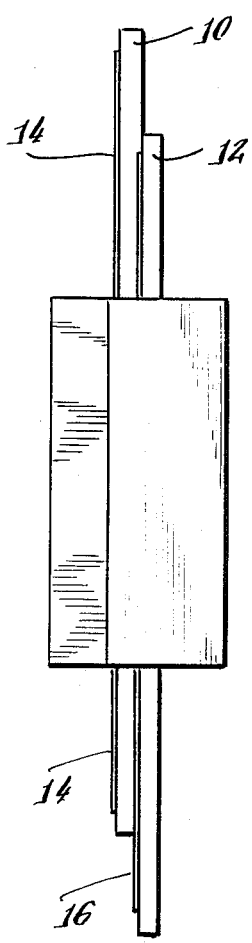
FIG. 2 is a side elevation view of the transformer shown in FIG. 1.
Figure 3:
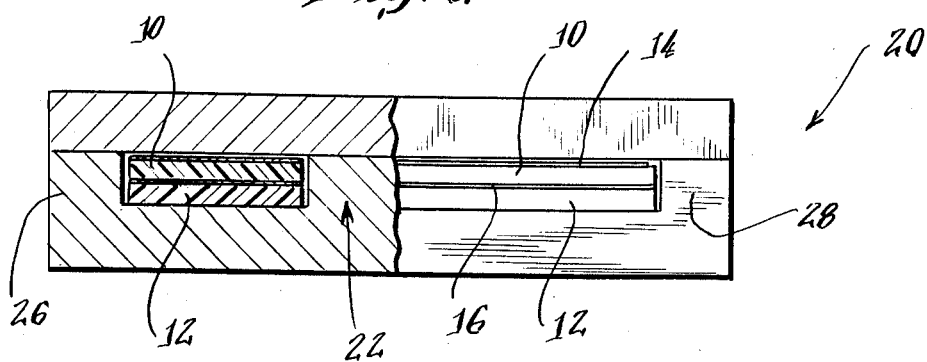
FIG. 3 is a vertical section taken along line 3—3 of FIG. 1.

Referring now to FIGS. 1–3, the transformer in accordance with the present invention comprises first and second rigid rectangular substrates 10 and 12 of alumina, held together in overlying position, and offset a short distance longitudinally. Each substrate carries on one flat surface thereof a film as generally indicated at 14 and 16. These films comprise a series of distinct layers of an insulating dielectric, with each layer having embedded therein a corresponding planar spiral winding in the form generally illustrated at 18 in FIG. 1. In the present embodiment, each of the two substrates 10 and 12 carries three such winding layers, for a total of six transformer windings.

The multi-layered films 14 and 16 preferably are formed by well-known thick-film processing techniques. In one such process, each individual winding layer of the film is developed by screen-printing a metallization pattern, comprising a matrix of conductive particles arranged (in this case) in a spiral configuration, and an overlay of insulating dielectric material such as a high temperature crystallizable glass dielectric insulating material available as a thick film paste. The screen-printed material then is either singly or co-fired at high temperature to complete the process.

Firing of the screen-printed material causes the conductive particles of the metallization pattern to be sintered and fused into a continuous conductor forming a planar spiral winding such as is generally indicated at 18 in FIG. 1. Firing also solidifies the glass insulating dielectric to form a rigid pancake-like structure with the planar spiral winding embedded therein. Thus, the windings comprise conductors formed of fused conductive particles embedded within the layer of dielectric insulating means which has been solidified by firing at high temperature to form a rigid structure with the windings hermetically sealed therein and conductively isolated from each other within the transformer. Preferably, copper particles are used for the conductors.

As noted above, each substrate 10, 12 carries three such winding layers. As will be described in more detail hereinbelow, a fourth layer also is laid over the top winding layer to provide cross-over electrical conductors for making connections from the inner ends of the three windings to corresponding termination points at the edge of each substrate. The screen-printing and firing procedure is carried out for each winding layer, and also for the fourth layer establishing the cross-over electrical connections. Each of the four screen-printed layers ordinarily will be about 1 mil thick (0.001"), whereas the supporting alumina substrate may have a thickness of about 0.015".

The central portions of the substrates 10, 12 are enclosed within a three-legged magnetic core 20, preferably composed of facing, mated E-I cores adhesively secured together at the regions of joinder. These E-I cores are assembled to the completed substrates with the central leg 22 of the E-core fitted into aligned rectangular holes 24 (see also FIG. 4) cut in the substrate prior to the thick-film processing. The side legs 26, 28 of the E-core extend down along the sides of the substrates to the regions of joinder with the flat I-core, to establish closed magnetic circuits passing through the substrate openings 24.

The screen-printed films 14, 16 applied to the substrates 10, 12 extend substantially to the edges of the central openings 24 cut into the substrates. The magnetic core leg 22 is dimensioned to provide a reasonably close fit with the openings 24, and serves to aid in holding the substrates in position.

As shown in FIG. 1, each substrate 10, 12 is provided at one end thereof with a set of termination pads 30, 32 for making electrical connections to the spiral windings generally indicated at 18. With the longitudinally offset arrangement of the substrates, both termination pads, 30, 32 are readily accessible from the same side of the transformer for establishing connections thereto.

The termination pads for each substrate are all located at a single level, thereby readily accommodating automated connection making. The termination pads on one substrate lead to the input windings of the transformer, and those on the other substrate lead to the output windings. The narrow and open-ended configuration provided, in one commercial package arrangement, over one inch of separation between the input and output connections. The input windings are separated vertically from the output windings by the thickness of one dielectric substrate, providing good insulation characteristics.

It will be seen that the transformer of this invention is especially suitable for adaptation to hybrid integrated circuit components, and can readily be mounted on a mother substrate together with other elements. A transformer as disclosed herein can be of extremely small size, e.g. having a "footprint" no larger than 0.75"×0.55", and a height of 0.2", even though the transformer includes six separate windings. Conventional connection techniques such as wire-bonding advantageously can be used to make electrical connection to the single-level termination pads 30, 32. As noted above, each substrate in the present embodiment carries three separate windings (in corresponding layers of the thick films 14, 16) requiring six terminals on each substrate. Such a transformer is particularly adapted for use in a single-transformer isolator of the type disclosed in U.S. Pat. No. 4,286,225.

In the disclosed embodiment, both substrates 10 and 12 are identical, with essentially identical multi-layered films 14 and 16 containing the sets of three spiral transformer windings. Since the winding arrangements are essentially identical, only one set of windings will be described hereinbelow.

Figure 4:
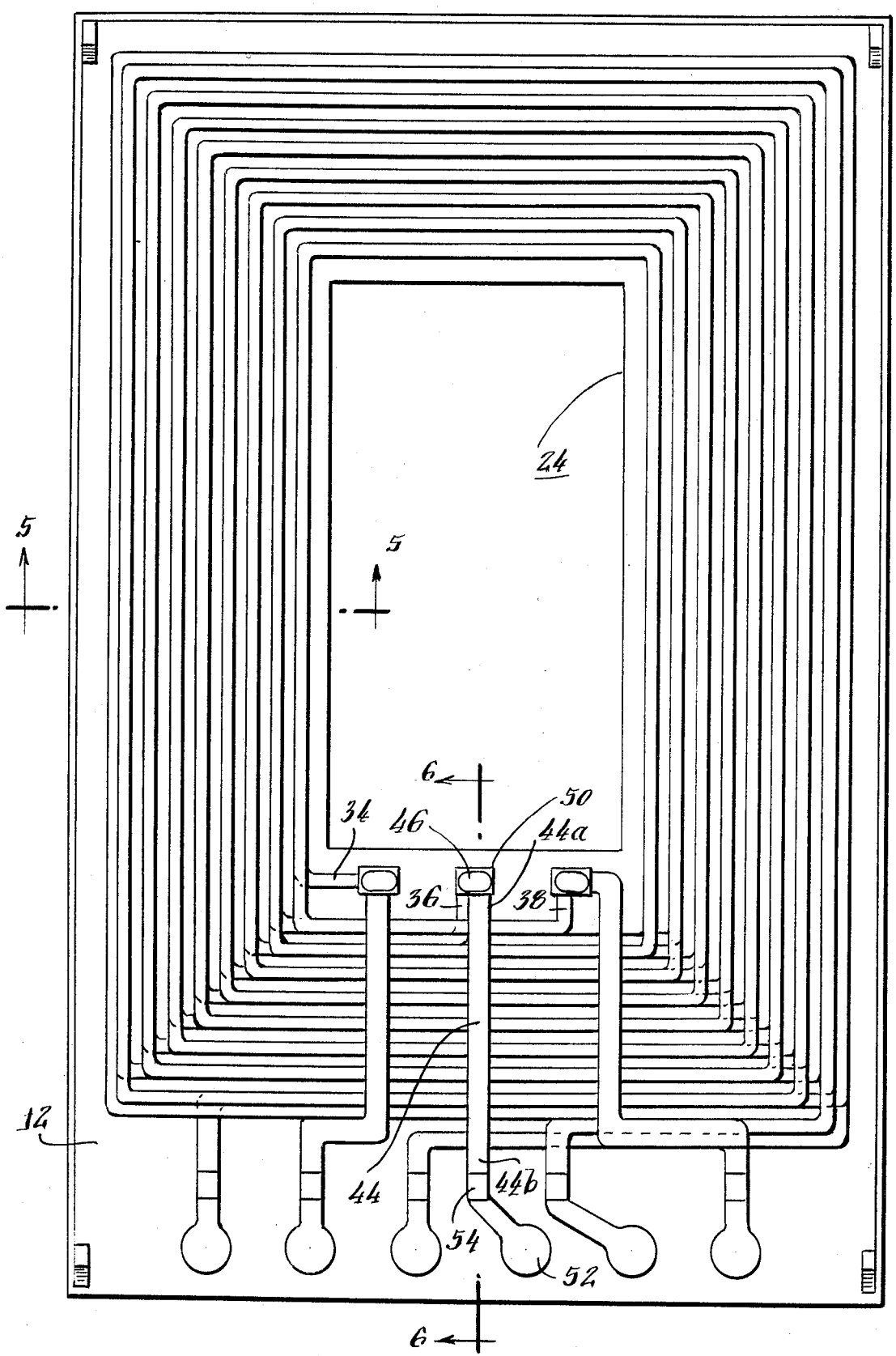
FIG. 4 is an enlarged plan view of one substrate of the transformer, showing the three transformer windings as though the insulating dielectric were transparent.
Figure 5:
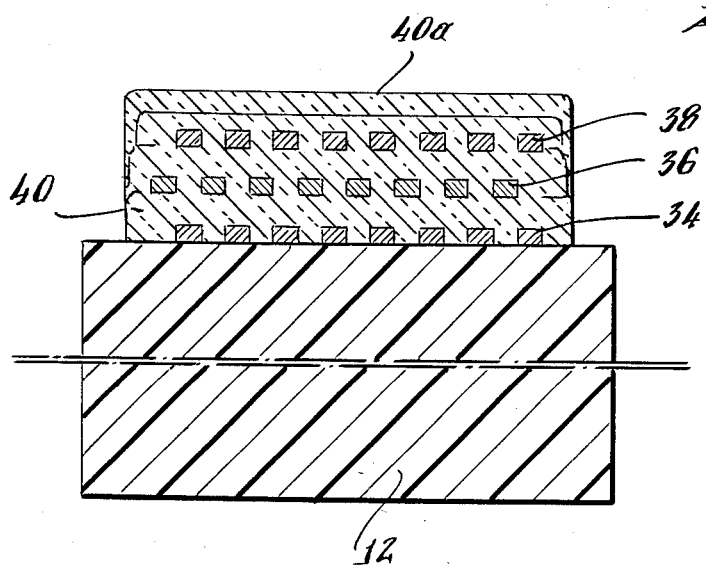
FIG. 5 is a detail section taken along line 5—5 of FIG. 4.
Figure 6:
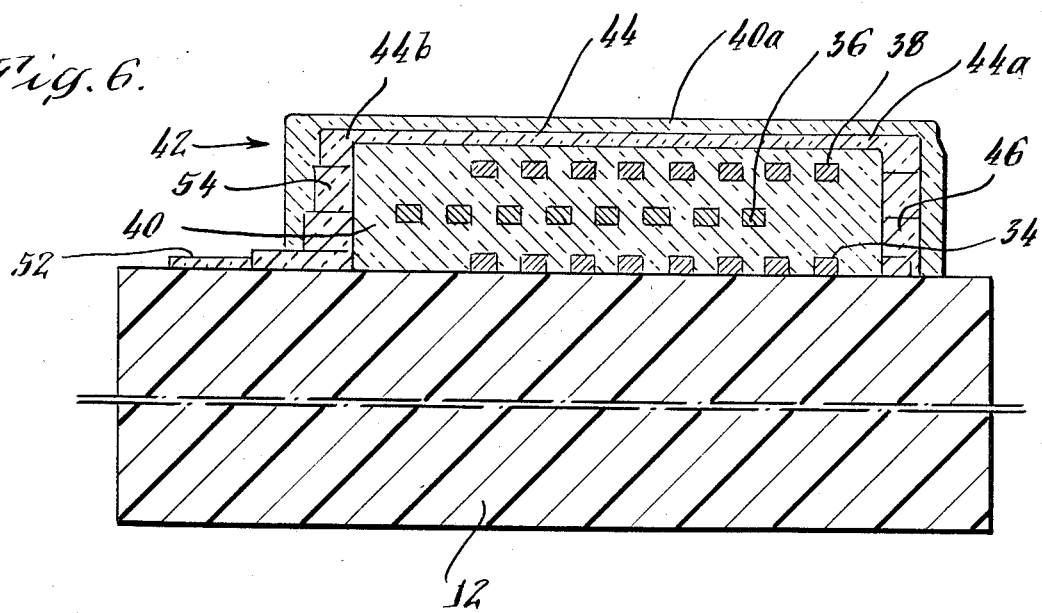
FIG. 6 is a detail section taken along line 6—6 of FIG. 4.

Referring now to the plan view of FIG. 4 and the sectional views of FIGS. 5 and 6, it can be seen that the spiral conductors of each of the three windings 34, 36, 38 are planar, with adjacent turns of the spiral being uniformly spaced apart. The conductors of the bottom and top windings 34, 38 are aligned vertically, while the conductors of the middle windings are offset laterally from those of the other two windings, to assure optimum spacing. Insulating dielectric 40 is laid down for each layer including the fourth layer 42 for the cross-over conductors. The dielectric material extends between and around the metallization layers, and includes an outer layer 40a.

Referring particularly to FIGS. 4 and 6, the fourth thick-film layer 42 comprises a set of cross-over return conductors such as the conductor illustrated at 44. That cross-over conductor is connected at its inner end 44a to the inner end of the corresponding spiral winding 36 by means of a vertical conductor 46. This conductor is formed in staircase fashion by a series of metallizations carried out during formation of the winding layers 34, 36, 38. Such vertical staircase conductor is located in a corresponding rectangular vertical opening 50 (FIG. 4) formed in the insulating dielectric 40 during screen-printing of the winding layers. The outer end 44b of the cross-over conductor 44 is connected to the corresponding terminal point 52 of the termination pad 26 by means of a vertical conductor 54 which also is formed in staircase fashion by a series of metallizations, just as in making the inner vertical conductor 46.

Excellent electrical characteristics of such a transformer include a very wide bandwidth (e.g. at least 30 MHz), and superior linear signal transfer characteristics, with close coupling between the windings, such that non-linearity of 0.005% maximum can be achieved. Moreover, such a transformer is capable of withstanding differentials of at least 10,000 volts (RMS) between input and output sections which is especially important for a transformer used as part of a high performance isolation amplifier.

From a mechanical point of view, the disclosed transformer has the significant advantage of ruggedness (withstanding accelerations up to 5000 g) and, especially, of being able to withstand very high temperatures such as 400° C. and above. The latter is important because such high-temperatures are encountered in secondary processing, i.e. where the transformer is assembled with other components to make a complete operative circuit, as part of hybrid integrated circuitry.

Use of thick-film multi-layer screen-printing and firing techniques provides effectively simultaneous completion of the winding layers, top-level return-line conductors and all interconnects. Thus, highly automated techniques can be employed to manufacture the basic transformer elements. Because of these factors, the cost of manufacture per winding is very low.

Although a specific preferred embodiment of the novel transformer construction of the present invention has been described hereinabove in detail, it is desired to emphasize that this detailed description is solely for the purpose of illustrating the invention, and is not to be considered as limiting the scope of the invention since it is clear that many variations and modifications can be made by those of skill in the art in order to meet the requirements of particular applications. For example, transformers in accordance with the invention can be provided with the different number of windings, various kinds of conductive materials and techniques can be used to form the windings, and different types of insulating dielectric can be employed.

We claim:

1. The method of making a miniaturized transformer comprising the steps of:

supporting on rigid non-magnetic substrate means a first metallization pattern in the form of a matrix of conductive particles arranged in a multi-turn planar spiral winding configuration about a central opening in the substrate means;

applying a first overlay of high-temperature firable dielectric insulating material to cover said first metallization pattern;

supporting on said substrate means a second metallization pattern in the form of a matrix of conductive particles arranged in a multi-turn planar spiral winding configuration about the central opening of said substrate means; said second winding being essentially coextensive with said first winding and conductively isolated therefrom;

applying a second overlay of high-temperature firable dielectric insulating material to cover said second metallization pattern;

firing said conductive particles and said dielectric material at a high temperature to fuse said conductive particles into continuous conductors forming separate planar windings and to solidify said insulating dielectric material to form rigid pancake-like structures with said windings embedded and hermetically sealed therein;

placing in said central opening a pre-formed solid magnetic core having a return path completely surrounding said substrate means;

establishing two pairs of connections to the ends of said two windings, respectively, with one connection of each pair extending across the corresponding winding to the interior region adjacent said central opening;

said pairs of connections being established by:

applying a third metallization pattern over one of said overlays of insulating dielectric to form a path from the inner part of the corresponding spiral winding to a region adjacent the outer part of the spiral by depositing conductive material on said substrate means to form a cross-over conductive pattern over said windings;

depositing conductive material on said substrate while laying down said first and second patterns to form at least one vertical staircase conductor in the interior of the spiral windings and leading from one winding end to said conductive cross-over;

applying a third overlay of high-temperarture firable dielectric insulating material to cover said third metallization pattern;

firing the conductive particles of said third metallization pattern and said third overlay of dielectric insulating material to form said particles into a continuous conductor running along said path and to solidify said third overlay of dielectric insulating material, thereby to form said cross-over pattern of conductive material for establishing connections to the inner part of said spiral winding; and firing said additional layer at high temperature thereby embedding said conductive cross-over in said layer for providing interconnections between said windings.

2. The method of claim 1, wherein said dielectric material is a high-temperature glass.

3. The method set forth in claim 1, wherein the conductive material is copper.

4. The method set forth in claim 1, wherein said central opening in said substrate means is formed by cutting the substrate with a laser beam prior to applying said overlays.

* * * * *